US009951912B2

(12) United States Patent
DeMille et al.

(10) Patent No.: US 9,951,912 B2
(45) Date of Patent: Apr. 24, 2018

(54) TUNABLE WHITE LIGHT BASED ON POLARIZATION SENSITIVE LIGHT-EMITTING DIODES

(71) Applicant: THE REGENTS OF THE UNIVERSITY OF CALIFORNIA, Oakland, CA (US)

(72) Inventors: Natalie Fellows DeMille, Carlsbad, CA (US); Hisashi Masui, Santa Barbara, CA (US); Steven P. DenBaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/567,889

(22) Filed: Dec. 11, 2014

(65) Prior Publication Data

US 2015/0092386 A1    Apr. 2, 2015

Related U.S. Application Data

(62) Division of application No. 12/536,253, filed on Aug. 5, 2009, now abandoned.

(Continued)

(51) Int. Cl.
*H01L 29/20* (2006.01)
*F21K 99/00* (2016.01)
(Continued)

(52) U.S. Cl.
CPC .......... *F21K 9/58* (2013.01); *F21K 9/65* (2016.08); *F21V 9/08* (2013.01); *F21V 9/10* (2013.01);
(Continued)

(58) Field of Classification Search
CPC .................................................. H01L 29/20
(Continued)

(56) References Cited

U.S. PATENT DOCUMENTS 6,507,380 B1  1/2003 Iijima
7,075,650 B1  7/2006 Johs et al.
(Continued)

OTHER PUBLICATIONS

Masui, H. et al., "Non-polar-oriented InGaN light-emitting diodes for liquid-crystal-display," J. Soc. Information Display 16, 571 (2008).

(Continued)

*Primary Examiner* — Marvin Payen
(74) *Attorney, Agent, or Firm* — Gates & Cooper LLP

(57) ABSTRACT

A lighting apparatus for emitting polarized white light, which includes at least a first light source for emitting primary light comprised of one or more first wavelengths and having a first polarization direction; and at least a second light source for emitting secondary light in the first polarization direction, comprised of one or more secondary wavelengths, wherein the first light and the secondary light are combined to produce a polarized white light. The lighting apparatus may further comprise a polarizer for controlling the primary light's intensity, wherein a rotation of the polarizer varies an alignment of its polarization axis with respect to the first polarization direction, which varies transmission of the primary light through the polarizer, which controls a color co-ordinate or hue of the white light.

13 Claims, 11 Drawing Sheets

Related U.S. Application Data

(60) Provisional application No. 61/106,035, filed on Oct. 16, 2008, provisional application No. 61/086,428, filed on Aug. 5, 2008.

(51) Int. Cl.

| | | |
|---|---|---|
| *H01L 25/075* | (2006.01) | |
| *H01L 33/00* | (2010.01) | |
| *H01L 33/58* | (2010.01) | |
| *F21V 9/08* | (2018.01) | |
| *F21V 9/10* | (2006.01) | |
| *F21V 9/14* | (2006.01) | |
| *H01L 33/32* | (2010.01) | |
| *H01S 5/00* | (2006.01) | |
| *H01S 5/343* | (2006.01) | |
| *F21K 9/65* | (2016.01) | |
| *H01L 33/16* | (2010.01) | |
| *H01L 33/50* | (2010.01) | |
| *F21Y 115/30* | (2016.01) | |
| *F21Y 115/10* | (2016.01) | |

(52) U.S. Cl.
CPC ............ *F21V 9/14* (2013.01); *H01L 25/0753* (2013.01); *H01L 33/0045* (2013.01); *H01L 33/32* (2013.01); *H01L 33/507* (2013.01); *H01L 33/58* (2013.01); *H01S 5/005* (2013.01); *H01S 5/34333* (2013.01); *F21Y 2115/10* (2016.08); *F21Y 2115/30* (2016.08); *H01L 33/16* (2013.01); *H01L 33/50* (2013.01); *H01L 2924/0002* (2013.01); *H01L 2933/0041* (2013.01)

(58) Field of Classification Search
USPC ....... 257/89, 98, 100, 102, E27.12, E33.055, 257/E33.061, E33.067; 438/29
See application file for complete search history.

(56) References Cited

U.S. PATENT DOCUMENTS

| | | |
|---|---|---|
| 7,090,359 B2 | 8/2006 | Kim et al. |
| 8,148,713 B2 | 4/2012 | Sato et al. |
| 2004/0178975 A1 | 9/2004 | Benedict |
| 2005/0214992 A1* | 9/2005 | Chakraborty ..... H01L 21/02378 438/172 |
| 2005/0224826 A1* | 10/2005 | Keuper ............... H01L 33/0004 257/98 |
| 2006/0284206 A1 | 12/2006 | Masui et al. |
| 2007/0247565 A1* | 10/2007 | Sasaki ................ C09B 67/0022 349/70 |
| 2008/0142816 A1 | 6/2008 | Bierhuizen et al. |
| 2008/0179607 A1 | 7/2008 | DenBaars et al. |
| 2009/0072693 A1* | 3/2009 | Cok ..................... H01L 27/3213 313/110 |
| 2009/0194761 A1 | 8/2009 | Masui et al. |
| 2009/0250686 A1 | 10/2009 | Sato et al. |
| 2010/0052008 A1 | 3/2010 | Masui et al. |
| 2010/0081226 A1 | 4/2010 | Abramov |
| 2010/0220262 A1 | 9/2010 | DeMille et al. |

OTHER PUBLICATIONS

Speier, I. et al., "Color temperature tunable white LED system," Sixth International Conference on Solid State Lighting, San Diego CA, Aug. 13-17, Proc. SPIE Int. Soc. Opt. Eng., vol. 6337 (2006).

Xie, Z. et al., "Chromacity-tunable white light emission from organic multiple-quantum-well structure," Opt. Quantum Electron., 32, 1325 (2000).

Fellows, N. et al., "Dichromatic color tuning with InGaN-based light-emitting diodes," Applied Physics Letters 93, 2008, pp. 121112-1-121112-3.

Heliotis, G. et al., "Wavelength-tunable and white-light emission from polymer-converted micropixellated InGaN ultraviolet light-emitting diodes," J. Opt. A: Pure Appl. Opt. 8, 2006, pp. S445-S449.

Masui, H. et al., "Light-polarization characteristics of electroluminescence from InGaN/GaN light-emitting diodes prepared on (1122)-plane GaN," Journal of Applied Physics 100, 2006, 113109-1-113109-5.

Masui, H. et al., "Optical polarization characteristics of light emission from sidewalls of primary-color light-emitting diodes," Semicond. Sci. Technol. 23, 2008, 4 pages.

Masui, H. et al., "Polarized light emission from nonpolar InGaN light-emitting diodes grown on a bulk m-plane GaN substrate," Japanese Journal of Applied Physics, vol. 44, No. 43, 2005, pp. L1329-L1332.

International Search Report dated Sep. 18, 2009, International application No. PCT/US2009/052847, International filing date Aug. 5, 2009.

\* cited by examiner

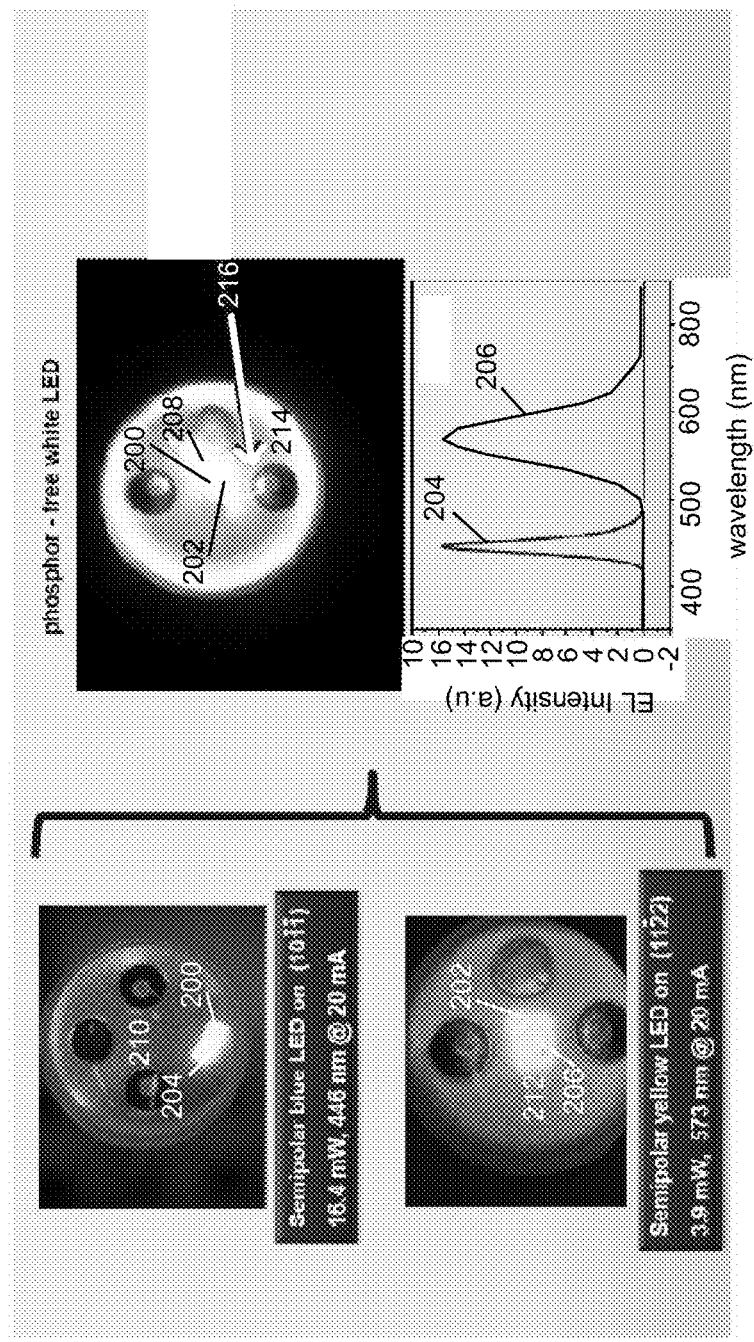

TUNABLE WHITE LIGHT BASED ON POLARIZATION SENSITIVE LIGHT-EMITTING DIODES

CROSS REFERENCE TO RELATED APPLICATIONS

This application is a divisional under 35 U.S.C. § 121 of commonly-assigned U.S. Utility patent application Ser. No. 12/536,253, filed on Aug. 5, 2009 by Natalie N. Fellows-DeMille, Hisashi Masui, Steven P. DenBaars, and Shuji Nakamura, and entitled "TUNABLE WHITE LIGHT BASED ON POLARIZATION SENSITIVE LIGHT-EMITTING DIODES," which application claims the benefit under 35 U.S.C. Section 119(e) of the following commonly-assigned applications:

U.S. Provisional Application Ser. No. 61/086,428, filed on Aug. 5, 2008, by Natalie N. Fellows, Hisashi Masui, Steven P. DenBaars, and Shuji Nakamura, entitled "TUNABLE WHITE LIGHT BASED ON POLARIZATION SENSITIVE LIGHT-EMITTING DIODES"; and U.S. Provisional Application Ser. No. 61/106,035, filed on Oct. 16, 2008, by Natalie N. Fellows, Hisashi Masui, Steven P. DenBaars, and Shuji Nakamura, entitled "WHITE LIGHT-EMITTING SEMICONDUCTOR DEVICES WITH POLARIZED LIGHT EMISSION"); which applications are incorporated by reference herein.

This application is related to the following commonly-assigned U.S. patent applications:

U.S. Utility application Ser. No. 12/272,588, filed on Nov. 17, 2008, now U.S. Pat. No. 7,723,746, issued May 25, 2010, by Hisashi Masui, Shuji Nakamura and Steven P. DenBaars, entitled "PACKAGING TECHNIQUE FOR THE FABRICATION OF POLARIZED LIGHT EMITTING DIODES," which application is a continuation of and claims the benefit under 35 U.S.C. Section 120 of U.S. Utility application Ser. No. 11/472,186, filed on Jun. 21, 2006, now U.S. Pat. No. 7,518,159, issued Apr. 14, 2009, by Hisashi Masui, Shuji Nakamura and Steven P. DenBaars, entitled "PACKAGING TECHNIQUE FOR THE FABRICATION OF POLARIZED LIGHT EMITTING DIODES," which application claims the benefit under 35 U.S.C. Section 119(e) of U.S. Provisional Application Ser. No. 60/692,514, filed on Jun. 21, 2005, by Hisashi Masui, Shuji Nakamura and Steven P. DenBaars, entitled "PACKAGING TECHNIQUE FOR THE FABRICATION OF POLARIZED LIGHT EMITTING DIODES";

U.S. Utility application Ser. No. 12/364,258, filed on Feb. 2, 2009, now U.S. Pat. No. 8,044,417, issued Oct. 25, 2011, by Hisashi Masui, Hisashi Yamada, Kenji Iso, James S. Speck, Shuji Nakamura, and Steven P. DenBaars, entitled "ENHANCEMENT OF OPTICAL POLARIZATION OF NITRIDE LIGHT-EMITTING DIODES BY INCREASED INDIUM INCORPORATION," which application claims the benefit under 35 U.S.C. Section 119(e) of U.S. Provisional Application Ser. No. 61/025,592, filed on Feb. 1, 2008, by Hisashi Masui, Hisashi Yamada, Kenji Iso, James S. Speck, Shuji Nakamura, and Steven P. DenBaars, entitled "ENHANCEMENT OF OPTICAL POLARIZATION OF NITRIDE LIGHT-EMITTING DIODES BY INCREASED INDIUM INCORPORATION";

U.S. Utility application Ser. No. 12/364,272, filed on Feb. 2, 2009, now U.S. Pat. No. 8,278,128, issued Oct. 2, 2012, by Hisashi Masui, Hisashi Yamada, Kenji Iso, Asako Hirai, Makoto Saito, James S. Speck, Shuji Nakamura, and Steven P. DenBaars, entitled "ENHANCEMENT OF OPTICAL POLARIZATION OF NITRIDE LIGHT-EMITTING DIODES BY WAFER OFF-AXIS CUT," which application claims the benefit under 35 U.S.C. Section 119(e) of U.S. Provisional Application Ser. No. 61/025,600, filed on Feb. 1, 2008, by Hisashi Masui, Hisashi Yamada, Kenji Iso, Asako Hirai, Makoto Saito, James S. Speck, Shuji Nakamura, and Steven P. DenBaars, entitled "ENHANCEMENT OF OPTICAL POLARIZATION OF NITRIDE LIGHT-EMITTING DIODES BY WAFER OFF-AXIS CUT";

U.S. Utility patent application Ser. No. 12/419,119, filed on Apr. 6, 2009, now U.S. Pat. No. 8,148,713, issued April 3, 201, by Hitoshi Sato, Hirohiko Hirasawa, Roy B. Chung, Steven P. DenBaars, James S. Speck and Shuji Nakamura, entitled "METHOD FOR FABRICATION OF SEMIPOLAR (Al,In,Ga,B)N BASED LIGHT EMITTING DIODES"; which application claims the benefit under 35 U.S.C. Section 119(e) of U.S. Provisional Patent Application Ser. No. 61/042,644, filed on Apr. 4, 2008, by Hitoshi Sato, Hirohiko Hirasawa, Roy B. Chung, Steven P. DenBaars, James S. Speck and Shuji Nakamura, entitled "METHOD FOR FABRICATION OF SEMIPOLAR (Al,In,Ga,B)N BASED LIGHT EMITTING DIODES";

U.S. Provisional Application Ser. No. 61/051,279, filed on May 7, 2008, by Hisashi Masui, Natalie N. Fellows, Shuji Nakamura and Steven P. DenBaars, entitled "UTILIZATION OF SIDEWALL EMISSION FROM LIGHT-EMITTING DIODES AS POLARIZED LIGHT SOURCES";

U.S. Provisional Application Ser. No. 60/051,286, filed on May 7, 2008, by Hisashi Masui, Shuji Nakamura, and Steven P. DenBaars, entitled "INTRODUCTION OF OPTICAL-POLARIZATION MAINTAINING WAVEGUIDE PLATES";

U.S. Provisional Application Ser. No. 61/088,251, filed on Aug. 12, 2008, by Hisashi Masui, Natalie N. Fellows, Steven P. DenBaars, and Shuji Nakamura, entitled "ADVANTAGES OF USING THE (1122) PLANE OF GALLIUM NITRIDE BASED WURTZITE SEMICONDUCTORS FOR LIGHT-EMITTING DEVICES"; and U.S. Utility application Ser. No. 12/536,400, filed on Aug. 5, 2009, by Natalie N. Fellows, Steven P. DenBaars, and Shuji Nakamura, entitled "LINEARLY POLARIZED BACKLIGHT SOURCE IN CONJUNCTION WITH POLARIZED PHOSPHOR EMISSION SCREENS FOR USE IN LIQUID CRYSTAL DISPLAYS," which application claims the benefit under 35 U.S.C. Section 119(e) of U.S. Provisional Application Ser. No. 61/086,431, filed on Aug. 5, 2008, by Natalie N. Fellows, Steven P. DenBaars, and Shuji Nakamura, entitled "LINEARLY POLARIZED BACKLIGHT SOURCE IN CONJUNCTION WITH POLARIZED PHOSPHOR EMISSION SCREENS FOR USE IN LIQUID CRYSTAL DISPLAYS";

which applications are incorporated by reference herein.

BACKGROUND OF THE INVENTION

1. Field of the Invention

This invention relates to a polarized white light source based on light-emitting semiconductor devices.

2. Description of the Related Art (Note: This application references a number of different publications as indicated throughout the specification by one or more reference numbers within brackets, e.g., [Ref(s). x]. A list of these different publications ordered according to these reference numbers can be found below in the section entitled "References." Each of these publications is incorporated by reference herein.)

The use of the present invention is for obtaining polarized white light based on semiconductor light-emitting devices such as light-emitting diodes (LEDs) and laser diodes (LDs). The LED includes super luminescent diodes (SLDs), which is a similar device to the LED. The applications for this embodiment of the present invention include, but are not limited to, display backlighting, two- and three-dimensional image projectors, and architectural lighting applications that require uniform color illumination.

Many LEDs show strongly polarized light emission due to their material properties. Prior to this invention, options for polarized white light included using a polarizer (polarizing polymer films) in conjunction with an unpolarized white light source. The problem with these solutions is the energy inefficiency (due to the light absorption by the polarizer), and the high manufacturing cost (due to extra components).

What is needed in the art are improved devices for emitting polarized white light and improved methods of manufacturing such devices. The present invention aims to satisfy this need by simplifying the manufacturing of and decreasing the cost for polarized white light devices.

The present invention may also be used for manipulating the various hues of white light based on LEDs. The applications for this embodiment of the present invention include, but are not limited to, general solid state lighting, backlighting, and architectural lighting applications that require uniform color illumination. Prior to this invention, options for tunable white light included using a number of different colored LEDs (red, green, blue) and changing their intensity individually [1], or introducing different colored, fluorescent, organic dyes as quantum-well light emitting layers [2] or conjugated hybrid polymers [3]. The problems with these solutions are the difficulty in manufacturing, the low efficiency (such as in the organic dyes), and the dependence on multiple light emitters in the first case [1].

What is needed in the art are improved devices for emitting tunable white light and improved methods of manufacturing such devices. The present invention aims to satisfy this need by simplifying the manufacturing of and decreasing the cost for tunable white light devices.

SUMMARY OF THE INVENTION

To overcome the limitations in the prior art described above, and to overcome other limitations that will become apparent upon reading and understanding the present specification, the present invention describes the use of polarization characteristics of LEDs (as well as SLDs and LDs), and additional fluorescent materials to create white light-emitting devices.

This invention also uses the polarization characteristic of the LED to create white LEDs that can change their color rendering qualities (i.e. their shade of white) by introducing a polarizing element. Since commercially available white LEDs have a fixed color coordinate after fabrication, this invention allows the color to be easily changed after production of the LED.

The embodiments of the present invention are not limited to a blue LED chip and phosphor layer. The present invention includes using different phosphors as well as using multiple polarization sensitive LED chips and LDs that would exclude phosphors. The present invention may use LEDs (or alternatively SLDs and LDs) that are capable of emitting polarized light (i.e., the LED, SLD, and LD itself is a source of polarized light).

Thus, to overcome the limitations in the prior art described above, and to overcome other limitations that will become apparent upon reading and understanding the present specification, the present invention discloses a white light-emitting device for emitting polarized white light, comprising one or more LEDs, SLDs, or LDs, that emit polarized light. The device utilizes a polarization property of the LEDs, LDs, or SLDs to emit the polarized white light, for example, wherein a combination of the polarized light and additional polarized light from an additional light source generates the polarized white light.

The LEDs, SLDs, or LDs may be nonpolar or semipolar LEDs, SLDs, or LDs comprising III-nitride based materials, wherein the nonpolar LEDs, SLDs, or LDs are typically fabricated on an m-plane or an a-plane of a wurtzite III-nitride based substrate or a III-nitride hetero-epitaxial template, and the semipolar LEDs, SLDs, or LDs are typically fabricated on any crystallographic plane other than a c, m, and a plane of a wurtzite III-nitride based substrate or a III-nitride hetero-epitaxial template. As a result, a light emitting active layer of the nonpolar or semipolar LEDs, SLDs, or LDs may experience reduced polarization induced fields and a reduced quantum confined stark effect as compared to a light emitting active layer of a polar light emitting device grown along a c-axis of III-nitride. The polarization induced fields are typically reduced at interfaces with the active layer.

The device may further comprise a plurality of the LEDs, SLDs, or LDs, wherein each LED, SLD, or LD is for emitting the polarized light having a different color or wavelength from light emitted by the other LEDs, SLDs, or LDs, and a combination of the light having different color or wavelength is the polarized white light.

Alternatively, or in addition, the device may further comprise the one or more LEDs, SLDs, or LDs emitting a single color of primary light, and one or more phosphors for emitting secondary light when optically pumped by the primary light, wherein a combination of the primary light and secondary light is the polarized white light having a same polarization as the primary light.

The phosphors may have a structure that maintains a polarization of the primary light, so that the secondary light has the polarization of the primary light. For example, the phosphors may be sufficiently crystalline to emit secondary light having a polarization ratio greater than 0.5.

Thus, the present invention describes a method of fabricating a white light-emitting device, and a method for emitting polarized white light, comprising providing one or more LEDs that emit polarized LED light that excites one or more phosphors to emit phosphor light, wherein polarization of the LED light and polarization of the phosphor light is in a same direction. The one or more LEDs may emit a shorter wavelength of polarized light that is converted into a longer wavelength of polarized light by one or more phosphors, wherein a resulting mixture of the shorter wavelength of polarized light and the longer wavelength of polarized light appears as white light.

The present invention further discloses a lighting apparatus for emitting white light, comprising (a) a first light source for emitting a primary light comprised of one or more first wavelengths and having a first polarization direction; (b) a second light source for emitting secondary light comprised of one or more second wavelengths, wherein the primary light and the secondary light are combined to produce a white light; and (c) a polarizer for controlling the primary light's intensity, wherein a rotation of the polarizer varies an alignment of its polarization axis with respect to the first polarization direction, which varies transmission of the primary light through the polarizer, which controls a color co-ordinate or hue of the white light.

The first light source and/or the second light source may be an LED, such as a nonpolar or semipolar III-nitride based LED. The second light source may be a phosphor optically pumped by the first light source, wherein the first light source emits blue light and the second light source emits yellow light. Alternatively, for example, the first wavelengths may be between 400 nm and 500 nm and the second wavelengths may be above 500 nm.

The lighting apparatus may further comprise the secondary light having a second polarization direction, and an additional polarizer for controlling the secondary light's intensity, wherein a rotation of the additional polarizer varies an alignment of its polarization axis with respect to a second polarization direction of the secondary light, which varies transmission of the secondary light through the additional polarizer, which controls the color co-ordinate or hue of the white light.

The lighting apparatus may further comprise one or more additional light sources for emitting additional light comprised of one or more additional wavelengths, wherein the primary light, the secondary light, and the additional light are combined to produce the white light with improved color rendering properties. In this case, the additional light source may have an additional polarization direction, and the apparatus may further comprise an additional polarizer for controlling the additional light's intensity, wherein a rotation of the additional polarizer varies an alignment of its polarization axis with respect to the additional polarization direction, which varies transmission of the additional light through the additional polarizer, which controls the color co-ordinate or hue of the white light.

Thus, the present invention discloses a method for fabricating a lighting apparatus emitting white light, comprising (a) providing a first light source for emitting primary light comprised of one or more first wavelengths and having a first polarization direction; (b) providing a second light source for emitting secondary light comprised of one or more second wavelengths, wherein the primary light and the secondary light are combined to produce a white light; and (c) providing a polarizer for controlling the primary light's intensity, wherein a rotation of the polarizer varies an alignment of its polarization axis with respect to the first polarization direction, which varies transmission of the primary light through the polarizer, which controls a color co-ordinate or hue of the white light.

BRIEF DESCRIPTION OF THE DRAWINGS

Referring now to the drawings in which like reference numbers represent corresponding parts throughout:

FIG. 2(a) is a top view photograph of a phosphor-free white lamp comprising a semipolar (10-1-1) LED (on the (10-1-1) plane) emitting blue light and a semipolar (11-22) LED (on the (11-22) plane) emitting yellow light, FIG. 2(b) plots the electroluminescence (EL) intensity (arbitrary units, a.u.) as a function of wavelength in nanometers (nm), for the semipolar (10-1-1) LED and the semipolar (11-22) LED in the white lamp, FIG. 2(c) is a top view photograph of the semipolar (10-1-1) LED emitting blue light of at least 16.4 milliwatts (mW) at 446 nm for 20 milliamps (mA) drive current, and FIG. 2(d) is a top view photograph of the semipolar (11-22) LED emitting yellow light of at least 3.9 mW at 573 nm for 20 mA drive current.

DETAILED DESCRIPTION OF THE INVENTION

Figure 1A:
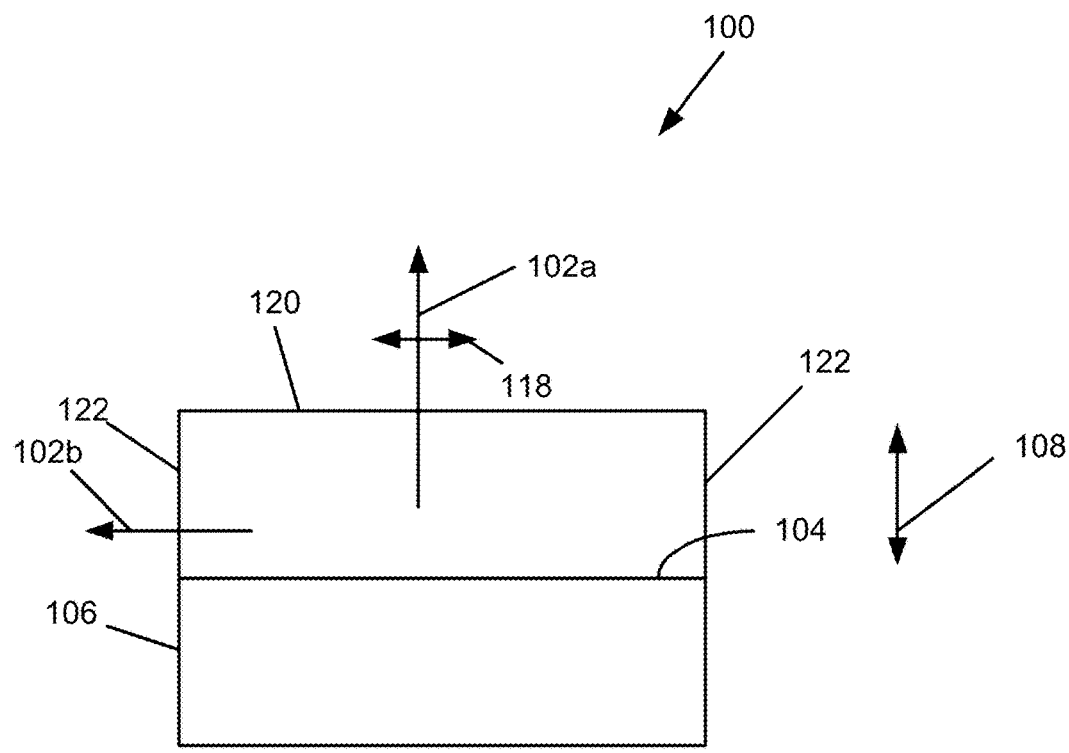
FIG. 1(a) is a cross-sectional schematic of a light-emitting device for emitting polarized light, according to an embodiment of the present invention.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

Using the present invention, polarized white light may be achieved without using conventional polarizing devices (e.g., polymer films) that generate polarized light from light emitted by unpolarized light sources (by absorbing a portion of the light's energy). The present invention creates highly energy efficient and more compact polarized white light sources, which may be used, for example, in imaging displays and in three-dimensional projectors based on liquid-crystal technologies. Nevertheless, the present invention does not exclude the use of any polarization elements that may be used for improving the polarization characteristics of white light-emitting devices claimed in the present invention.

Using the present invention, tunable white light may also be achieved and an end user can change their preference for white light by simply rotating a polarizing element. This invention allows for a completely new line of products, mainly white lighting whose hue can be changed by a consumer. It should also lower cost, since lower tolerances can be used for the color coordinates of white light, because they can be changed post-processing.

Nomenclature

The term "(Al,Ga,In)N" or III-nitride as used herein is intended to be broadly construed to include respective nitrides of the single species, Al, Ga, and In, as well as binary, ternary and quaternary compositions of such Group III metal species. Accordingly, the term (Al,Ga,In)N comprehends the compounds AlN, GaN, and InN, as well as the ternary compounds AlGaN, GaInN, and AlInN, and the quaternary compound AlGaInN, as species included in such nomenclature. When two or more of the (Ga,Al,In) component species are present, all possible compositions, including stoichiometric proportions as well as "off-stoichiometric" proportions (with respect to the relative mole fractions present of each of the (Ga,Al,In) component species that are present in the composition), can be employed within the broad scope of the invention. Accordingly, it will be appreciated that the discussion of the invention hereinafter in reference to GaN materials is applicable to the formation of various other (Al,Ga,In)N material species. Further, (Al,Ga,In)N materials within the scope of the invention may further include minor quantities of dopants and/or other impurity or inclusional materials.

Technical Description

Polarized White Light Embodiment

This embodiment of the present invention works by using polarization sensitive LEDs, SLDs, and LDs with or without phosphor materials. LEDs (SLDs and LDs are also included) are fabricated via crystal growth and photolithographic processes applied to wafer materials. Certain crystallographic planes (such as nonpolar and semipolar planes) have crystallographic asymmetry that causes polarized light emission. Polarized light emission can be confirmed experimentally by applying a polarizing element to the LED, resulting in a sinusoidal dependence of the intensity of the light emitted from the LED depending on the orientation of the polarizing element.

III-nitride based semiconductor crystals form wurtzite structures. The wurtzite structure is a two-constituent hexagonal lattice, where the polar planes (the c planes) are defined to be crystallographic planes perpendicular to the hexagonal prism axis (the c axis). Nonpolar planes are crystallographic planes parallel to the c axis; major nonpolar planes are the m (10-10) and a (11-20) planes. Semipolar planes are any planes that make an angle other than 0 or 90 degrees with the c axis. Major semipolar planes are (10-1-1), (10-1-3), and (11-22) planes.

FIG. 1(a) illustrates a light emitting device 100 that can be used in a white light emitting device for emitting polarized white light, comprising an LED, SLD, or LD, that emits polarized light 102a, 102b (e.g., typically, although not necessarily, different from white light, e.g., a single color of primary light). The light emitting device 100 is nonpolar or semipolar and comprises III-nitride based materials, and is on a crystallographic plane 104 of a wurtzite III-nitride based substrate 106 (or wurtzite III-nitride based hetero-epitaxial template). If the crystallographic plane 104 is a nonpolar plane (e.g., a-plane or m-plane), the light emitting device 100 is nonpolar. If the crystallographic plane 104 is a plane other than the c, m, and a plane of a wurtzite III-nitride based substrate or hetero-epitaxial template 106, the light emitting device 100 is semipolar. Also shown is the orientation 108 of the III-nitride based material, wherein the arrow 108 indicates the nonpolar axis (e.g., m-axis or a-axis) direction of the III-nitride in the case of a nonpolar light emitting device 100, and any other axis (other than a c-axis) in the case of a semipolar light emitting device 100.

Figure 1B:
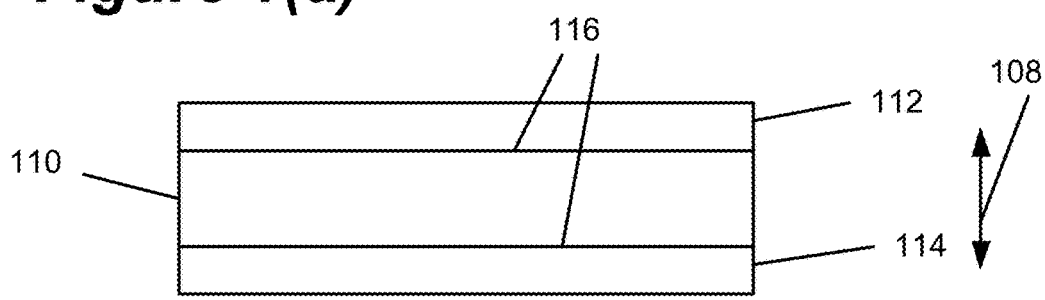
FIG. 1(b) is a cross-sectional schematic of a light emitting active layer of the light-emitting device for emitting polarized light, according to an embodiment of the present invention.

FIG. 1(b) illustrates the light emitting device 100 typically further comprises a III-nitride light emitting active region 110 (typically an indium containing quantum well, such as, but not limited to InGaN) between barrier layers 112, 114 (e.g. GaN). The active region 110 emits the light 102a, 102b. The layers 110, 112, 114 are typically between a III-nitride n-type layer and a III-nitride p-type layer, wherein the n-type layer, p-type layer, and layers 110-114 may be on the substrate 106, for example. The semipolar or nonpolar light emitting device's 100 light emitting active layer 110 experiences reduced polarization induced fields and a reduced quantum confined stark effect, as compared to a polar light emitting active layer in a polar light emitting device grown along a c-axis of III-nitride. The polarization induced fields are reduced at interfaces 116 with the active layer 110, wherein the interfaces 116 are semipolar or nonpolar planes of III-nitride.

The emitted light 102a, 102b is polarized, typically linearly polarized with a direction 118 and a polarization ratio. The polarization ratio of light (p) is commonly defined as:

$$\rho = (I_a + I_b)/(I_a - I_b)$$

where $I_a$ and $I_b$ are the intensities of the light 102a, 102b having polarization (electric fields) parallel to the in-plane directions a and b, respectively, where the a and b directions are orthogonal to each other and in the same plane (e.g., but not limited to, parallel to, or in the plane of, the device top surface 120). In other words, $I_a$ is the intensity of the light 102a, 102b having polarization in the direction a, and $I_b$ is the intensity of the light 102a, 102b having polarization in the direction b. When ρ is zero, that is $I_a=I_b$, light 102a, 102b is un-polarized. When $I_a$ is not equal to $I_b$, light 102a, 102b is (partially) linearly polarized. When $I_a$ or $I_b$ is zero (that is, ρ is unity), light 102a,102b is (perfectly) linearly polarized. An equivalent definition of polarization ratio is $$\rho=(I_\perp-I_\parallel)/(I_\perp+I_\parallel)$$

where $I_\perp$ is the intensity of light 102a having a polarization component perpendicular to a polarizer's polarizing axis (wherein the polarizer is used to measure the light's 102a polarization), and $I_\parallel$ is the intensity of light having a polarization parallel to the polarizer's polarizing axis, as described in [6].

LEDs can be used to obtain white light in a number of configurations. The present invention uses two methods: a combination of multiple LEDs (or SLDs, LDs) that each emit light of different colors to produce white light; and an LED (or an SLD, LD, or multiple chips), combined with a common phosphor (or multiple phosphors) which acts as a wavelength converter. Phosphors are often small spherical-like particles (nevertheless, they can be large single crystals) that absorb certain wavelengths of light and re-emit the light at lower energies (or longer wavelengths). Using a yellow phosphor that is excited by a blue LED chip is one way to produce white light; and this is the method used in one embodiment of the present invention. The blue LED chip emits polarized light (i.e. the LED is itself a source of polarized light). Phosphor materials can emit secondary light while maintaining the polarization of incoming excitation light when the system is properly designed.

Polarized White Light Using Multiple LEDs

FIG. 2(*a*) illustrates an embodiment of a white-light emitting device comprising plurality of the light emitting devices 200, 202 wherein each light emitting device 200 is for emitting polarized light 204 having a different color or wavelength from light 206 emitted by the other light emitting devices 202, (e.g., LED 200 emits blue light 204 and LED 202 emits yellow light 206, as indicated in FIG. 2(*b*)), and a combination of the light 204, 206 having different color or wavelength is polarized white light 208. FIGS. 2(*c*) and 2(*d*) illustrate the LEDs 200 and 202, respectively, on separate headers 210, 212, respectively. In FIG. 2(*a*), the LEDs 200 and 202 are on the same header 214 and are wire bonded in parallel 216.

The nature of the white light generated suggests the former method (using multiple LEDs 200, 202) is suitable for full-color projectors, for example, by individually operating the LEDs in order to produce many different colors. For this method, all LEDs need to be properly aligned so that the polarization of the light 204, 206 emitted from each LED 200, 202 is in the same direction and a liquid-crystal shutter element can function. Other embodiments include, but are not limited to, growing one LED that comprises multiple nonpolar or semipolar light emitting active layers, wherein each of the light emitting active layers emits different colors and wavelengths of light that can be combined to create white light, as described for example, in [5].

Polarized White Light Using Phosphors

Figure 3:
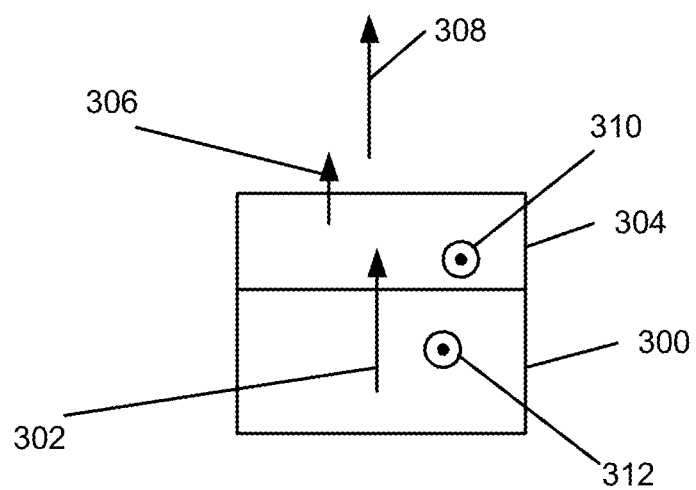
FIG. 3 is a cross-sectional schematic of an embodiment of a white light-emitting device for emitting polarized white light, comprising a phosphor.

FIG. 3 illustrates a white light emitting device comprising a light emitting device 300 emitting a single color of primary light 302; and one or more phosphors 304 for emitting secondary light 306 when optically pumped by the primary light 302, wherein a combination of the primary light 302 and secondary light 306 is the polarized white light 308 having a same polarization direction as the primary light 302. While FIG. 3 illustrates the phosphor 304 coating the light emitting device 300, the phosphor 304 may be positioned remotely from the light emitting device 300.

This method using phosphors is suitable for liquid-crystal displays, either monochromatic or multi-color displays. To achieve the polarized white light 308 using this method, the LED(s) 300 and phosphors 304 need to be properly aligned. For example, a single crystal YAG phosphor has a particular polarization axis 310, which should be parallel to the polarization axis 312 of the LED 300. When a polymer fluorescent film is used as a phosphor 304, its polarization axis 310 (often determined by the film stretching) needs to be parallel to the LED's 300 polarization axis 312. In FIG. 3, the polarization axes 310 and 312 are perpendicular to the plane of the paper.

Figure 4:
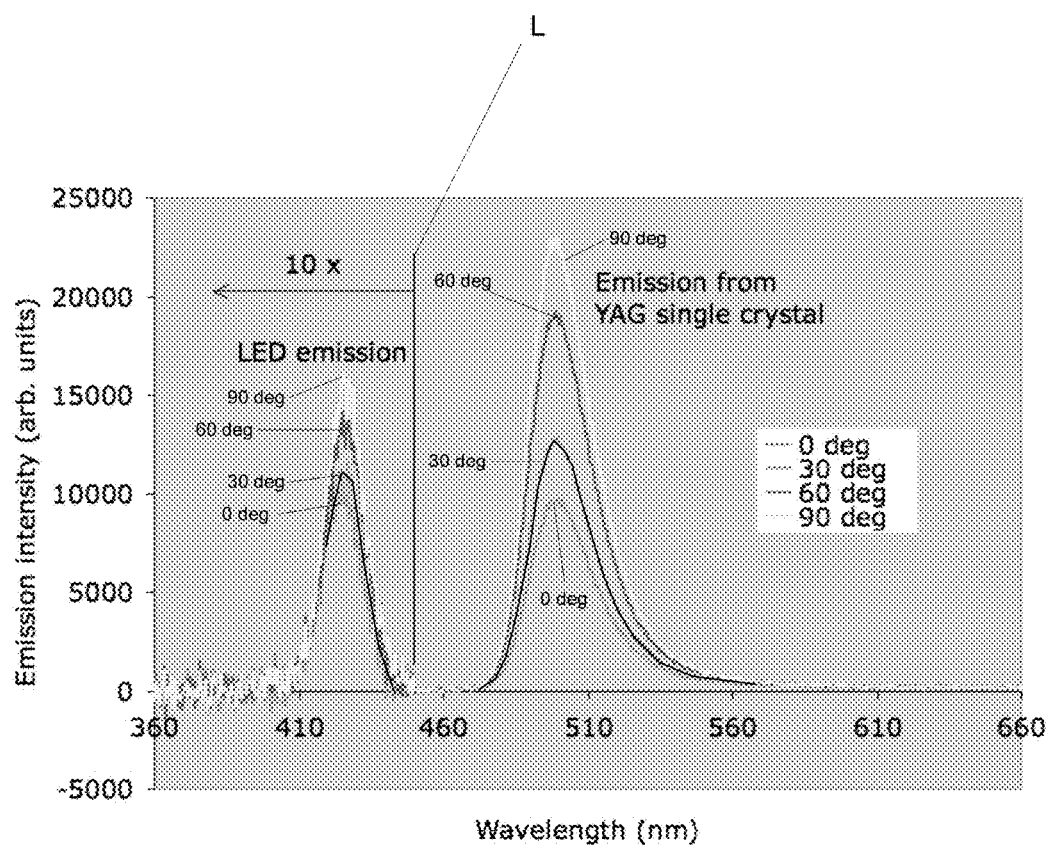
FIG. 4 is a graph of the light emission spectrum of an exemplary white LED, plotting emission intensity, in arbitrary units (a.u.), as a function of wavelength (nm), for different polarizer angles expressed in degrees (deg) (from top curve to bottom curve: 90 deg, 60 deg, 30 deg and 0 deg), wherein the angles indicate the polarizer orientation, the spectrum was obtained from a III-nitride-based m-plane blue LED combined with a single crystal YAG:Ce disk emitting yellow light (when optically pumped by the blue light from the LED), the measurement was performed by inserting a polarizer between the white LED and a spectrometer, and FIG. 4 clearly confirms that both light components (blue light from the LED emission with a wavelength between 360 nm and 460 nm, and yellow light from the YAG single crystal phosphor emission with a wavelength between 460 nm and 660 nm) have the same polarization direction, proving that the yellow emission from the YAG:Ce crystal maintains the polarization of the LED blue light.
Figure 5:
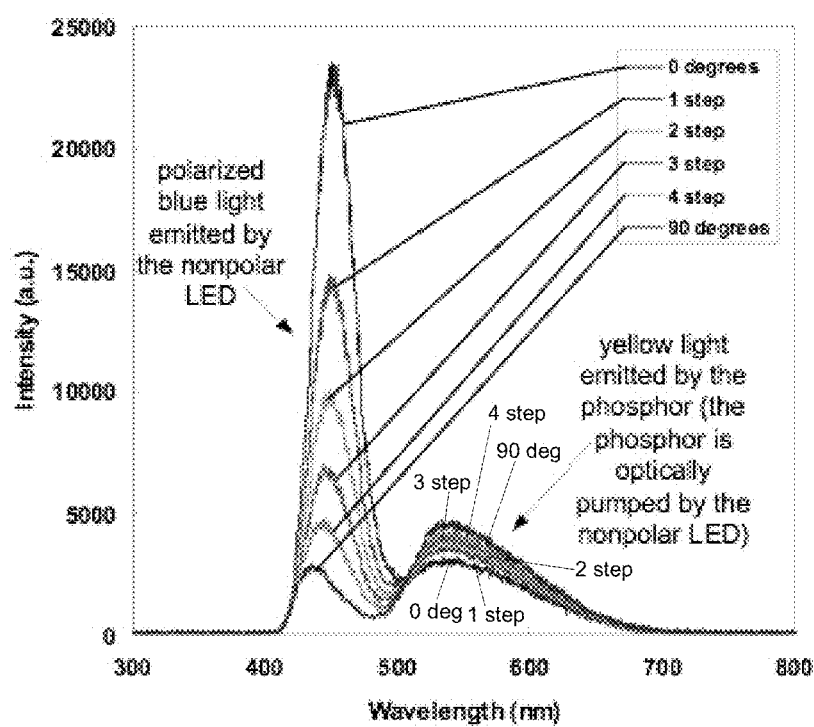
FIG. 5 is a graph plotting intensity (a.u.) as a function of wavelength (nm) for different polarizer angles from 0 deg to 90 deg for the polarized blue light (having wavelength between 400 nm and 500 nm) emitted by the nonpolar LED, from the top curve to the bottom curve: 0 deg, 1 step, 2 step, 3 step, 4 step, and 90 deg; and for the yellow light (having wavelength between 500 nm and 800 nm) emitted by the phosphor optically pumped by the nonpolar LED, from top curve to bottom curve: 90 deg, 4 step, 3 step, 2 step, 1 step, and 0 deg, wherein a "step" corresponds to an increment of the polarizer angle between 0 deg and 90 deg, when powder YAG:Ce phosphors are used in conjunction with a polarized blue LED, showing the yellow emission from the YAG is barely polarized or often weakly polarized in the perpendicular direction, and that unpolarized light is not highly useful for the present invention, as described in the present document.

FIG. 4 indicates the case where both light components (the blue light from the LED and the yellow light from the phosphor) have the same polarization, while FIG. 5 indicates the case where two color components (blue light from the LED and yellow light from the phosphor) have different polarizations. In FIG. 4, the emission intensity to the left of the line L has been magnified (or multiplied) by a factor of 10 (×10) for clarity.

The present invention is distinct from any conventional white light sources which emit unpolarized white light. Conventionally, when polarized light is necessary, e.g., in liquid-crystal displays, a polarized element (e.g., polymer films) is employed to absorb and waste the unnecessary polarization components, therefore an energy loss over 50% is inevitable. The present invention discloses a polarized white light source that never existed here-to-fore; the white light source emits white light which is already polarized, so that the energy efficiency can be much higher than conventional devices which are based on unpolarized light sources. In addition, the present invention has the ability to make the light sources smaller by eliminating polarization elements. In cases where the polarization characteristics of the present polarized white light-emitting devices need to be improved, a polarizer (e.g., polarization polymer films) can be employed; in such a case, energy waste by the polarizer is still less than the case of unpolarized white light sources, and thus the advantage of the present invention is obtained in energy savings.

Tunable White Light Embodiment

This embodiment of the present invention works by using polarization sensitive LEDs in conjunction with a polarizing element. LEDs may be fabricated via crystal growth and photolithographic processes applied to wafer materials. As discussed above, certain crystallographic planes (such as nonpolar and semipolar planes), due to directional dependence of the electron transition rates, show optical polarization. When a polarizing element is used in conjunction with an LED grown on these crystal planes (or using these crystal planes), a sinusoidal dependence of the intensity of the light emitted from the LED, depending on the orientation of the polarizing element, can be obtained. However, a number of different LEDs (SLDs, LDs) may be used.

Also as described above, LEDs can be used to obtain polarized white light in a number of different configurations, such as using a common phosphor as a wavelength converter, or by using multiple LEDs.

Tunable White Light Using Phosphors

Figure 6:
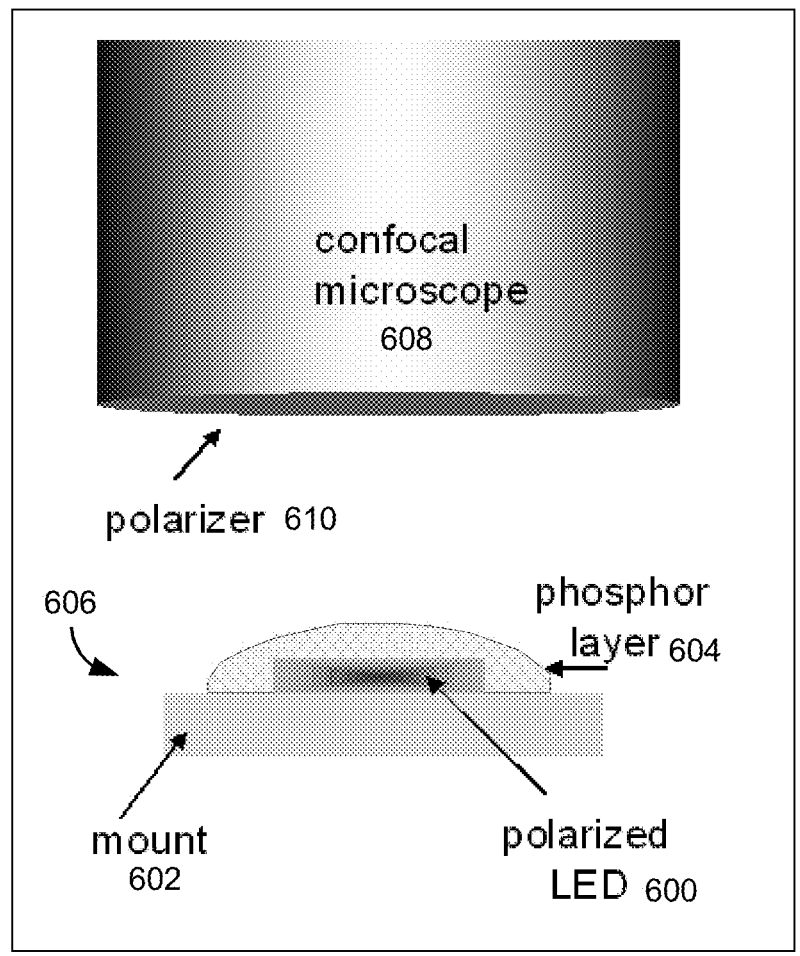
FIG. 6 is a cross-sectional schematic of a setup for a tunable white LED comprising a phosphor.

FIG. 6 illustrates an example of the tunable white light of the present invention, wherein a polarized LED 600 emitting polarized light is placed onto a conventional LED mount 602, and a phosphor layer 604 is placed on top of the polarized LED 600. The resulting apparatus 606 is placed underneath a confocal microscope 608 setup that includes a polarizer 610.

Figure 7:
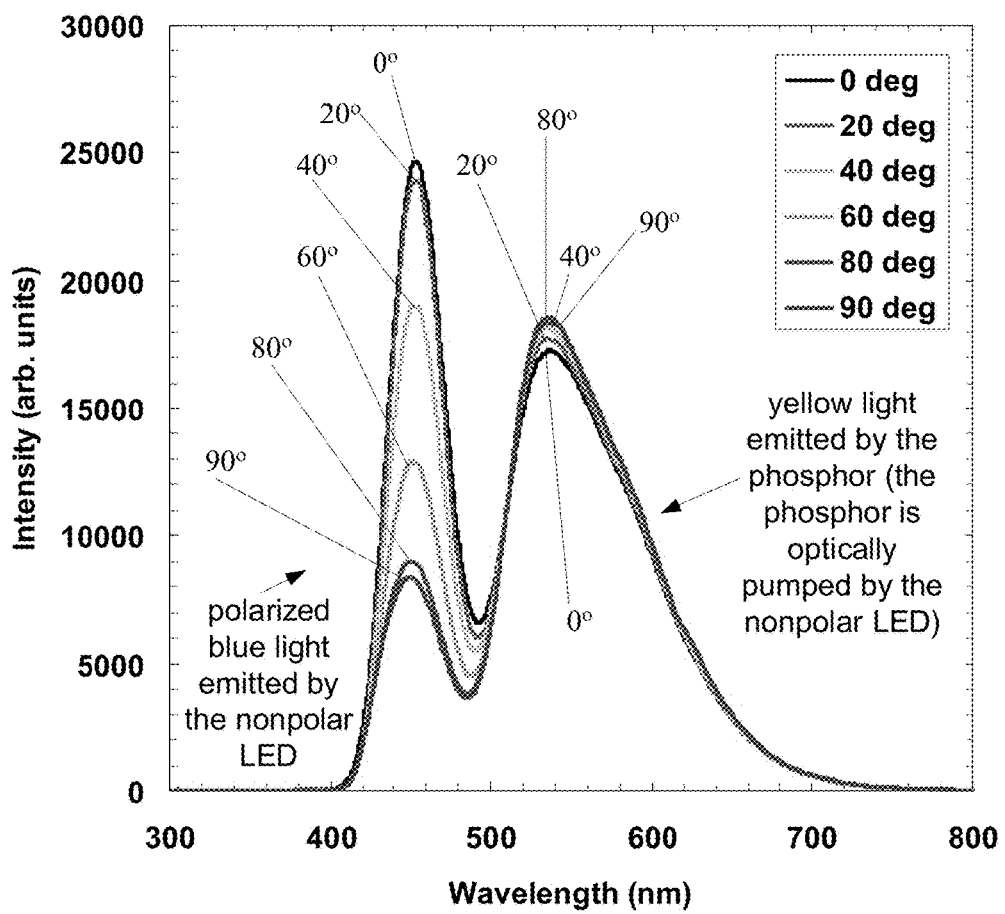
FIG. 7 shows emission spectra of an LED combined with a phosphor for different polarization angles ($\varphi=0°$, 20° 40°, 60°, 80°, and 90°) of a polarizer (angles measured in degrees (°)), plotting intensity (a.u.) as a function of wavelength (nm) for the different polarization angles for the polarized blue light (having wavelength between 400 nm and 500 nm) emitted by the nonpolar LED, from top curve to the bottom curve: $\varphi=0°$, 20° 40°, 60°, 80°, and 90°; and for the yellow light (having wavelength between 500 nm and 800 nm) emitted by the phosphor when optically pumped by the nonpolar LED, from bottom curve to the top curve: $\varphi=0°$, 20° 40°, 60°, 80°, and 90°.

The confocal microscope 608 setup is used to measure the spectra of the light emitted from the apparatus 606 at various angles of the polarizer 610. These spectra are shown in FIG. 7, and plot the intensity of light as emitted by an m-plane nonpolar GaN based LED 600 (emitting blue light polarized parallel to the <0001> direction of the LED 600) and a phosphor 604 emitting yellow light (when optically pumped by the blue light from the m-plane nonpolar GaN based LED 600), as a function of wavelength and intensity, for different polarizer angles, φ (where φ is the angle between the polarizer axis and the <11-20> direction of the LED). The spectra of FIG. 7 are measured after the blue light emitted by the LED 600 and/or the yellow light emitted by the phosphor 604 has passed through the polarizer 610. The combination of the blue light and yellow light appears as white light.

Because the blue light is polarized, the intensity of the blue LED light can be changed with different polarizer angles which results in different color coordinates. In FIG. 7, the polarizer angle is the angle between the polarizing axis of the polarizer 610 and the <0001> direction of the m-plane GaN LED 600, and the polarizer angle φ was varied in a range from 0 to 90 degrees, and 0 degrees corresponds to a position of the polarizer 610 where the polarizing axis of the polarizer 610 is perpendicular with the <0001> direction of the LED 600, which is also the polarization direction of the light emitted by the LED. Thus, when the light's polarization is parallel with the polarizing axis of the polarizer 610, substantially all of the light incident on the polarizer 610 is transmitted through the polarizer 610. FIG. 7 shows that, because the blue light from the LED 600 is polarized, the intensity of the blue light component of the white light can be varied by rotating the polarizing axis of the polarizer 610 in or out of alignment with the blue light's polarization direction, so that the polarizer 610 blocks or transmits more or less of the polarized blue light.

Thus, white light can be obtained by combining polarized light emitted from an LED (for example, an m-plane GaN based LED emitting polarized blue light) and light emitted by a phosphor (for example, a YAG phosphor) optically pumped by the LED. The color of the white light may be changed (for example, from cool white to warm white) by extinguishing, for example, the blue light with a polarizer. The light emitted by the phosphors may be polarized as well, for example, either perpendicular or parallel to the orientation to the LED's polarization. This is the first white light emitting LED that may be tuned after the LED has been fabricated.

Tunable White Light Using Multiple LEDs

Figure 8A:
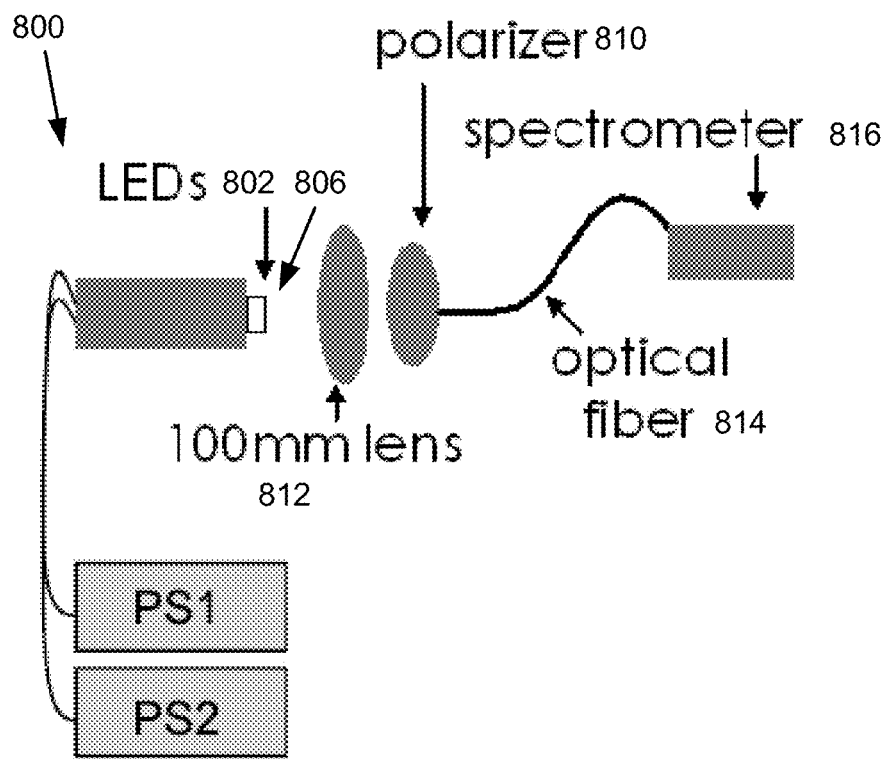
FIG. 8(a) is a schematic of a lighting apparatus for emitting tunable white light, comprising LEDs, as well as a lens, optical fiber, and spectrometer used to characterize the white light and power supplies to power the lighting apparatus.
Figure 8B:
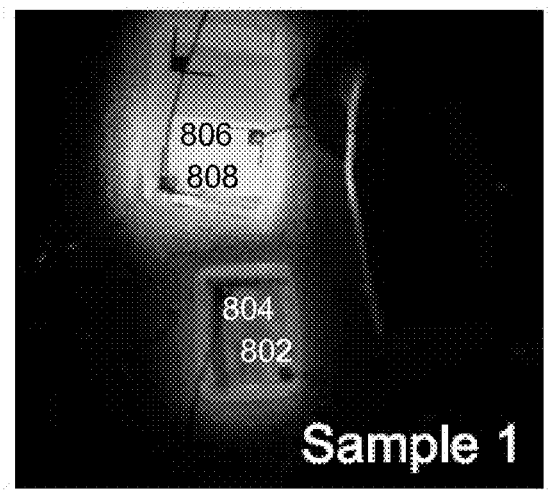
FIG. 8(b) is a top view photograph of the nonpolar blue LED and the semipolar yellow LED in the lighting apparatus of FIG. 8(a).
Figure 8C:
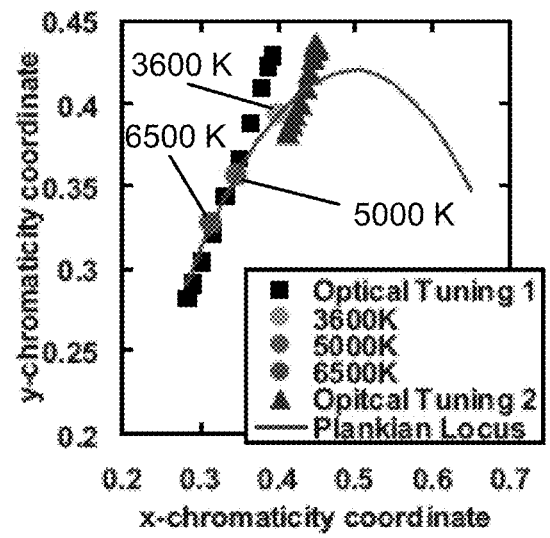
FIG. 8(c) plots y-chromaticity co-ordinate as a function of x-chromaticity co-ordinate for the white light generated by the apparatus of FIG. 8(a), for different polarizer angles, and for different samples: a blue LED emitting at 457 nm at 1 mA drive current and a yellow LED emitting at 583 nm at 7 mA (triangles), and a blue LED emitting at 467 nm at 2 mA and a yellow LED emitting at 572 nm at 26 mA (squares), wherein the correlated color temperature (CCT) of 3600 Kelvin (K), 5000 K, and 6500 K, is also shown.

FIG. 8(a) illustrates a lighting apparatus 800 for emitting white light, comprising: (a) a first light source 802 (e.g., LED) for emitting a primary light 804 comprised of one or more first wavelengths (as shown in FIG. 8(b)); (b) a second light source 806 (e.g., LED) for emitting secondary light 808 comprised of one or more second wavelengths (as shown in FIG. 8(b)), wherein the primary light 804 and the secondary light 808 are combined to produce a white light (as shown in FIG. 8(c)); and (c) a polarizer 810 for controlling the primary light's 804 intensity, and/or for controlling the secondary light's 818 intensity.

In order to characterize the white light, a lens 812 (e.g. 100 millimeter focal length) may used to focus the white light into an optical fiber 814 that transports the white light to the spectrometer 816. PS1 and PS2 are power supplies for the LEDs 802 and 806, respectively. Both LEDs 802 and 806 are attached to a single header with three leads (the dies 802 and 806 share a common negative).

Figure 8D:
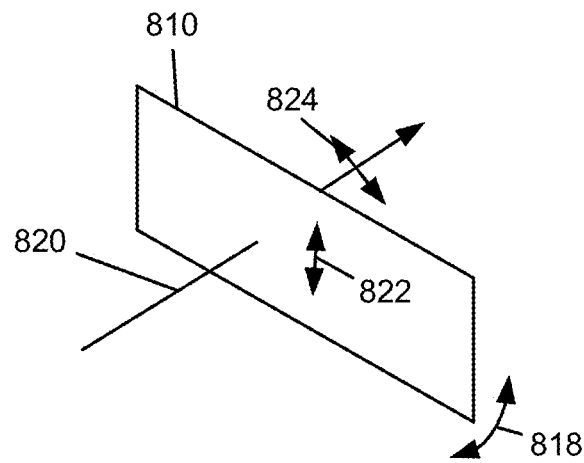
FIG. 8(d) is a schematic illustrating the rotation of the polarizer in the lighting apparatus of the present invention.
Figure 8E:
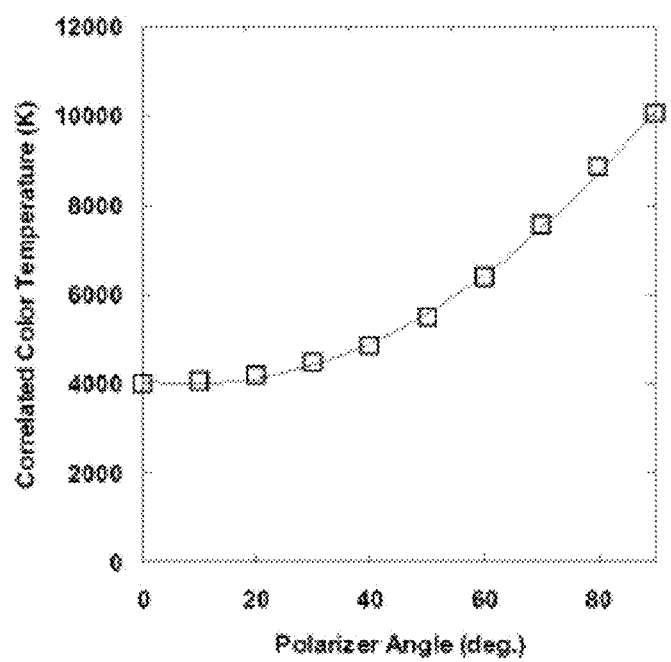
FIG. 8(e) plots correlated color temperature, in Kelvin (K), of the white light, as a function of polarizer angle in degrees (deg.), obtained using the lighting apparatus of FIG. 8(a).

FIG. 8(d) illustrates how a rotation 818 of the polarizer 810, e.g., about the optical axis 820 (the light's 804 propagation direction), varies an alignment of the polarizer's 810 polarization axis 822 with respect to the first polarization direction 824 of the primary light 804, which varies transmission of the primary light 804 through the polarizer 810, which controls a color co-ordinate or hue of the white light, as shown in FIG. 8(e).

Instead of using one polarizer 810, the apparatus 800 may further comprise an additional polarizer for controlling the secondary light's 808 intensity (using the principle illustrated in FIG. 8(d)). In addition, the apparatus may comprise additional light sources (e.g., additional LEDs), wherein the primary light 804, the secondary light 808, and the additional light from the additional light source are combined to produce the white light and improved color rendering properties. Additional polarizer(s) can be used to control the additional light's intensity, also using the principle illustrated in FIG. 8(d).

Method of Fabrication

Figure 9:
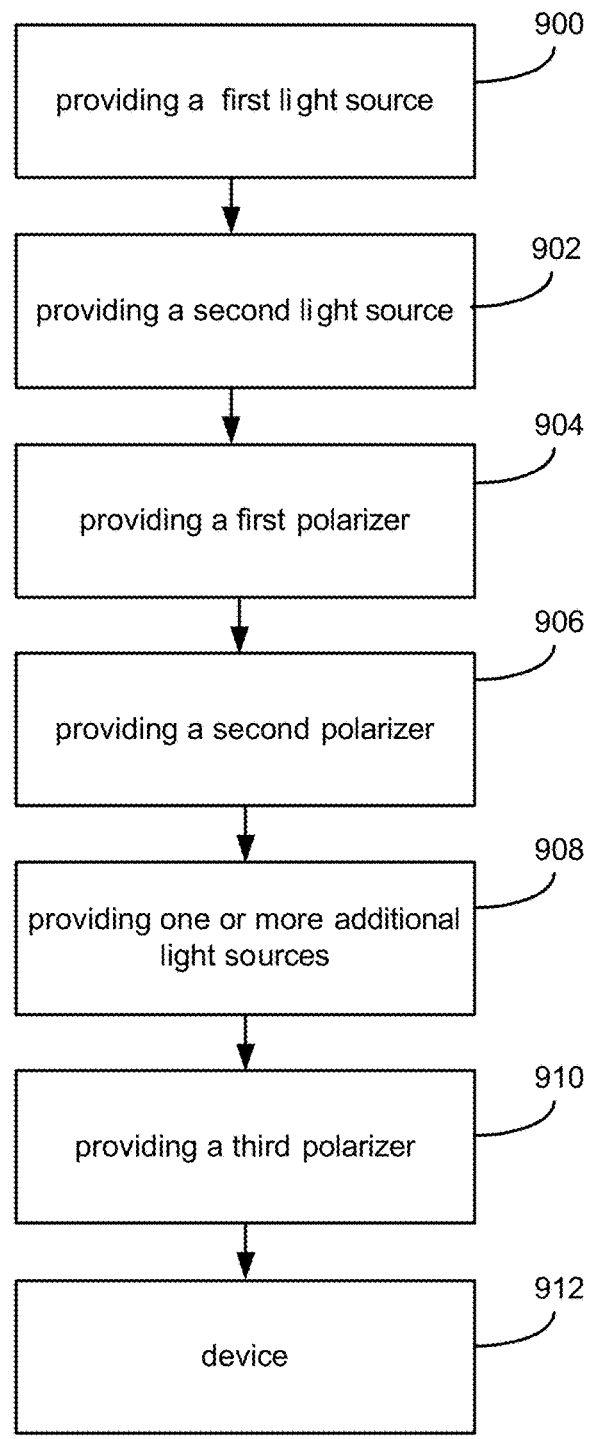
FIG. 9 is a flowchart illustrating a method of fabricating a white light-emitting device.

FIG. 9 is a flowchart illustrating a method of fabricating a white light-emitting device for emitting polarized white light. The method comprises one or more of the following steps.

Block 900 represents providing a first light source for emitting a primary light comprised of one or more first wavelengths and having a first polarization direction, such as one or more first light emitting devices that emit polarized light. The light emitting devices may be one or more LEDs, SLDs, or LDs, for example, and may be nonpolar or semipolar light emitting devices comprising III-nitride based materials. The nonpolar light emitting device may be fabricated on an m-plane or an a-plane of a wurtzite III-nitride based substrate or III-nitride hetero-epitaxial template. The semipolar light emitting device may be fabricated on any crystallographic plane other than the c, m, and a plane of a wurtzite III-nitride based substrate or III-nitride hetero-epitaxial template. The III-nitride hetero-epitaxial templates may be III-nitride crystal films prepared on foreign substrates. Foreign substrates include non-III-nitride materials, such as sapphire, spinel, silicon, GaAs, or glass, etc.

Block 902 represents providing a second light source for emitting secondary light comprised of one or more second wavelengths, so that the primary light and the secondary light may be combined to produce a white light. The second light source may be one or more phosphors, wherein the polarized first light source's or light emitting device's light excites or optically pumps the one or more phosphors to emit phosphor light, and the polarization of the light emitting device's light and polarization of the phosphor light is in the same direction. In one example, the light emitting devices emit a shorter wavelength of polarized light that is converted into a longer wavelength of polarized light by the one or more phosphors, wherein a resulting mixture of the shorter wavelength of polarized light and the longer wavelength of polarized light appears as white light. Alternatively, the second light source may be a second light emitting device, such as a nonpolar or semipolar III-nitride based LED, wherein the second light emitting device is for emitting polarized light having a different color or wavelength from light emitted by the first light emitting devices, and a combination of the light having different color or wavelength, and the polarized light emitted by the first light emitting devices is the polarized white light.

Block 904 represents providing a first polarizer for controlling the primary light's intensity, so that a rotation of the polarizer may vary an alignment of its polarization axis with respect to the first polarization direction, which varies transmission of the primary light through the polarizer, which controls a color co-ordinate or hue of the white light.

Block 906 represents providing an additional (or second) polarizer for controlling the secondary light's intensity, so that a rotation of the additional (or second) polarizer may vary the alignment of its polarization axis with respect to the second polarization direction of the secondary light, which varies transmission of the secondary light through the additional (or second) polarizer, which controls the color co-ordinate or hue of the white light (using the principle illustrated in FIG. 8(d)).

Block 908 represents providing one or more additional light sources for emitting additional light comprised of one or more additional wavelengths, so that the primary light, the secondary light, and the additional light may be combined to produce the white light with improved color rendering properties.

Block 910 represents providing an additional (third) polarizer for controlling the additional light's intensity, so that the rotation of the additional (third) polarizer may vary the alignment of its polarization axis with respect to the additional polarization direction of the additional light, which varies transmission of the additional light through the additional (third) polarizer, which controls the color co-ordinate or hue of the white light (using the principle illustrated in FIG. 8(d)).

Block 912 represents the end result of the method, a white light-emitting device. However, not all steps represented by blocks 900-910 are required. For example, a white light-emitting device may be fabricated using Blocks 900 and 902 only, Blocks 900, 902, and 904 only, Blocks 900, 902, 904, and 906 only, Blocks 900, 902 and 908 only, and Blocks 900, 902, 908, and 910 only.

Possible Modifications and Variations

Light emitting devices used in the present invention comprise LEDs, LDs and SLDs. SLDs are optoelectronic devices similar to LEDs. While conventional LEDs utilize spontaneous emission, SLDs utilize stimulated emission. Nevertheless, SLDs are different from LDs in not having a cavity structure (LDs utilize stimulated emission obtained from a laser cavity). As a result, light emission from SLDs is narrow in spectrum but not coherent, so that the speckle that often creates visual disturbance in laser projection displays is suppressed. SLDs are often edge emitting devices, like LDs, and optical polarization is commonly high because of the waveguide effects provided by their device structure. For the same reason, the directionality of light emission is better than LEDs, which is advantageous in display applications. Nevertheless, LDs are also capable of exciting phosphors to make white light based on the technique of the present invention; thus the LD is included in the present invention.

Variations of the present invention include: using semi-polar and nonpolar LEDs (GaN, InGaN, AlGaN, InN, AlN) at differing wavelengths, using various phosphor materials (or fluorescent materials), varying the placement of the polarizer (between phosphor and emitting chip or after both phosphor and chip), varying the placement of the phosphor (conformal coating, applied directly onto the LED, SLD, or LD, remote placement, e.g. remote placement or spatial separation of the phosphor from the LED, SLD, or LD chip), and removing the phosphor layer altogether and using colored, polarized chips.

The phosphors may have any crystallographic form, for example, single crystals or single crystalline, poly crystalline, amorphous, or thin films, etc. The phosphors may comprise different materials, for example, any material that fluoresces, or one or more garnet-based materials (e.g., YAG or YAG doped with Cerium (Ce)). The phosphors typically have a structure that maintains a polarization of the primary light optically pumping the phosphor, so that the secondary light emitted by the phosphor has the polarization of the primary light. For example, the phosphors may be sufficiently crystalline to emit secondary light having a polarization ratio greater than 0.5.

The phosphors may be suspended in a clear matrix. The clear matrix may be, for example one or more polymer sheets, epoxy, or glass, or similar material, etc.

The phosphors may be shaped into one or more high light extraction efficiency structures, such as spheres, cones, rods, or gratings, etc, or the phosphors may be roughened, for example.

The light emitting devices that comprise LEDs, SLDs, or LDs may emit Ultraviolet (UV), violet, blue light of wavelengths between 360 and 470 nm, or wavelengths above 500 nm. For example, the first wavelengths emitted by the first light source may be between 400 nm and 500 nm (e.g., blue light), and the second wavelengths emitted by the second light source may be above 500 nm (e.g., yellow light). However, LEDs, SLDs, or LDs that emit other wavelengths may also be used.

Advantages and Improvements

Advantages of the present invention include higher efficiency in obtaining polarized white light than the conventional technique where unpolarized light emission from a light source is used. Also, the present invention enables more compact polarized white light sources. This is a novel technology since no other LED based white lighting utilizes the polarization property of the LED chip.

REFERENCES

The following references are incorporated by reference herein.

[1] I. Speier, M. Salsbury, and I. T. Ferguson, 6$^{th}$ International Conference on Solid State Lighting, San Diego, Ca, August 13-17. In Proc. SPIE Int. Soc. Opt. Eng. Vol. 6337 (2006).

[2] Z. Xie, J. Huang. J. Feng, and S. Liu, Opt. Quantum Electron., 32, 1325 (2000).

[3] G. Heliotis, E. Gu, C. Griffin, C. W. Jeon, P. N. Stavrinou, M. D. Dawson, and D. D. C. Bradley, J. Opt. A: Pure Appl. Opt. 8, 5445 (2006).

[4] Polarized light can also be obtained from LEDs by using the technique described in: H. Masui et al., Semicond. Sci. Technol. 23, 072001 (2008); and U.S. Provisional Application Ser. No. 61/051,279, filed on May 7, 2008, by Hisashi Masui, Natalie N. Fellows, Shuji Nakamura and Steven P. DenBaars, entitled "UTILIZATION OF SIDE-WALL EMISSION FROM LIGHT-EMITTING DIODES AS POLARIZED LIGHT SOURCES".

[5] U.S. Utility patent application Ser. No. 12/419,119, filed on Apr. 6, 2009, by Hitoshi Sato, Hirohiko Hirasawa, Roy B. Chung, Steven P. DenBaars, James S. Speck and Shuji Nakamura, entitled "METHOD FOR FABRICATION OF SEMIPOLAR (Al,In,Ga,B)N BASED LIGHT EMITTING DIODES"; which application claims the benefit under 35 U.S.C. Section 119(e) of U.S. Provisional Patent Application Ser. No. 61/042,644, filed on Apr. 4, 2008, by Hitoshi Sato, Hirohiko Hirasawa, Roy B. Chung, Steven P. DenBaars, James S. Speck and Shuji Nakamura, entitled "METHOD FOR FABRICATION OF SEMIPOLAR (Al,In,Ga,B)N BASED LIGHT EMITTING DIODES."

[6] Single crystal luminescent material polarization and phosphor polarization is discussed in U.S. Utility application Ser. No. 12/536,400, filed on same date herewith, by Natalie N. Fellows, Steven P. DenBaars, and Shuji Nakamura, entitled "LINEARLY POLARIZED BACKLIGHT SOURCE IN CONJUNCTION WITH POLARIZED PHOSPHOR EMISSION SCREENS FOR USE IN LIQUID CRYSTAL DISPLAYS," which application claims the benefit under 35 U.S.C. Section 119(e) of U.S. Provisional Application Ser. No. 61/086,431, filed on Aug. 5, 2008, by Natalie N. Fellows, Steven P. DenBaars, and Shuji Nakamura, entitled "LINEARLY POLARIZED BACKLIGHT SOURCE IN CONJUNCTION WITH POLARIZED PHOSPHOR EMISSION SCREENS FOR USE IN LIQUID CRYSTAL DISPLAYS."

[7] Light polarization of III-nitride nonpolar LEDs is described in: H. Masui et al., Jpn. J. Appl. Phys. 44, L1329 (2005); U.S. Utility application Ser. No. 12/364,272, filed on Feb. 2, 2009, by Hisashi Masui, Hisashi Yamada, Kenji Iso, Asako Hirai, Makoto Saito, James S. Speck, Shuji Nakamura, and Steven P. DenBaars, entitled "ENHANCEMENT OF OPTICAL POLARIZATION OF NITRIDE LIGHT-EMITTING DIODES BY WAFER OFF-AXIS CUT," which application claims the benefit under 35 U.S.C. Section 119(e) of U.S. Provisional Application Ser. No. 61/025,600, filed on Feb. 1, 2008, by Hisashi Masui, Hisashi Yamada, Kenji Iso, Asako Hirai, Makoto Saito, James S. Speck, Shuji Nakamura, and Steven P. DenBaars, entitled "ENHANCEMENT OF OPTICAL POLARIZATION OF NITRIDE LIGHT-EMITTING DIODES BY WAFER OFF-AXIS CUT"; and U.S. Utility application Ser. No. 12/364,258, filed on Feb. 2, 2009, by Hisashi Masui, Hisashi Yamada, Kenji Iso, James S. Speck, Shuji Nakamura, and Steven P. DenBaars, entitled "ENHANCEMENT OF OPTICAL POLARIZATION OF NITRIDE LIGHT-EMITTING DIODES BY INCREASED INDIUM INCORPORATION," which application claims the benefit under 35 U.S.C. Section 119(e) of U.S. Provisional Application Ser. No. 61/025,592, filed on Feb. 1, 2008, by Hisashi Masui, Hisashi Yamada, Kenji Iso, James S. Speck, Shuji Nakamura, and Steven P. DenBaars, entitled "ENHANCEMENT OF OPTICAL POLARIZATION OF NITRIDE LIGHT-EMITTING DIODES BY INCREASED INDIUM INCORPORATION."

[8] Light polarization and advantages of III-nitride semipolar LEDs is described in: H. Masui et al., J. Appl. Phys. 100, 113109 (2007); and U.S. Provisional Application Ser. No. 61/088,251, filed on Aug. 12, 2008, by Hisashi Masui, Natalie N. Fellows, Steven P. DenBaars, and Shuji Nakamura, entitled "ADVANTAGES OF USING THE (1122) PLANE OF GALLIUM NITRIDE BASED WURTZITE SEMICONDUCTORS FOR LIGHT-EMITTING DEVICES."

[9] Waveguiding techniques and delivery of polarized light is described in U.S. Provisional Application Ser. No. 60/051,286, filed on May 7, 2008, by Hisashi Masui, Shuji Nakamura, and Steven P. DenBaars, entitled "INTRODUCTION OF OPTICAL-POLARIZATION MAINTAINING WAVEGUIDE PLATES."

[10] The potential of the display application of nonpolar LEDs has been demonstrated and described in: H. Masui et al., J. Soc. Information Display 16, 571 (2008).

[11] N. N. Fellows et al., "Dichromatic color tuning with InGaN-based light-emitting diodes," Appl. Phys. Lett. 93 121112 (2008), discussing polarized white LEDs with two colors.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A white light-emitting device for emitting polarized white light, comprising:
    one or more Light Emitting Diodes (LEDs), Super Luminescent Diodes (SLDs), or Laser Diodes (LDs) that emit at least blue polarized light; and
    one or more phosphors for emitting yellow polarized light when optically pumped by the blue polarized light, wherein:
    the LEDs, SLDs, or LDs are III-nitride LEDs, SLDs, or LDs;
    the phosphors have a structure that is sufficiently crystalline to maintain a polarization of the blue polarized light so that the yellow polarized light has the polarization of the blue polarized light and the yellow polarized light has a polarization ratio greater than 0.5; and
    a combination of the blue polarized light and the yellow polarized light is polarized white light having a same polarization as the blue polarized light.

2. The device of claim 1, wherein the LEDs, SLDs, or LDs are nonpolar LEDs, SLDs, or LDs fabricated on an m-plane or an a-plane of a wurtzite III-nitride substrate.

3. The device of claim 1, wherein the LEDs, SLDs, or LDs are semipolar LEDs, SLDs, or LDs fabricated on any crystallographic plane other than a c-plane, m-plane or a-plane of a wurtzite III-nitride based substrate.

4. The device of claim 3, further comprising a light emitting active layer of the LEDs, SLDs, or LDs that experiences reduced polarization induced fields and a reduced quantum confined stark effect as compared to a light emitting active layer of a polar light emitting device grown along a c-axis of III-nitride, wherein the polarization induced fields are reduced at interfaces with the active layer.

5. The device of claim 1, wherein the device utilizes a polarization property of the LEDs, LDs, or SLDs to emit the polarized white light.

6. The device of claim 1, further comprising:
    a polarizer for controlling the blue polarized light's intensity, wherein a rotation of the polarizer varies an alignment of its polarization axis with respect to the blue polarized light's polarization direction, which varies transmission of the blue polarized light through the polarizer, which controls a color co-ordinate or hue of the white light.

7. The device of claim 6, further comprising an additional polarizer for controlling the yellow polarized light's intensity, wherein a rotation of the additional polarizer varies an alignment of its polarization axis with respect to a polarization direction of the yellow polarized light, which varies transmission of the yellow polarized light through the additional polarizer, which controls the color co-ordinate or hue of the white light.

8. The device of claim 6, further comprising one or more additional light sources for emitting additional light comprised of one or more additional wavelengths, wherein the blue polarized light, the yellow polarized light, and the additional light are combined to produce the white light with improved color rendering properties.

9. The lighting apparatus of claim 8, wherein the additional light source has an additional polarization direction, and the device further comprises an additional polarizer for controlling the additional light's intensity, wherein a rotation of the additional polarizer varies an alignment of its polarization axis with respect to the additional polarization direction, which varies transmission of the additional light through the additional polarizer, which controls the color co-ordinate or hue of the white light.

10. A method of fabricating a white light-emitting device for emitting polarized white light, comprising
providing one or more Light Emitting Diodes (LEDs), Super Luminescent Diodes (SLDs), or Laser Diodes (LDs) that emit at least blue polarized light; and
positioning one or more phosphors for emitting yellow polarized light when optically pumped by the blue polarized light, wherein:

the LEDs, SLDs, or LDs are III-nitride LEDs, SLDs, or LDs;
the phosphors,
comprise a single cry it; phosphor having a polarization axis and a structure that is sufficiently crystalline to maintain a polarization of the blue polarized light,
are positioned to receive the blue polarized light, and
aligned such that the polarization axis of the single crystal phosphor is parallel to one or more polarization axes of the LEDs, SLDs, or LDs,
so that the yellow polarized light has the polarization of the blue polarized light and the yellow polarized light has a polarization ratio greater than 0.5; and
a combination of the blue polarized light and the yellow polarized light is polarized white light having a same polarization as the blue polarized light.

11. The device of claim 1, wherein:
one or more of the phosphors comprise a single crystal phosphor having a polarization axis, and
the single crystal phosphor is positioned to receive the blue polarized light and aligned such that the polarization axis of the single crystal phosphor is parallel to one or more polarization axes of the LEDs, SLDs, or LDs.

12. The device of claim 1, wherein the device does not include a polarizer positioned to polarize the yellow light or the blue light.

13. The method of claim 10, wherein the device does not include a polarizer positioned to polarize the yellow light or the blue light.

* * * * *